United States Patent [19]

Andreini et al.

[11] Patent Number: 4,892,836

[45] Date of Patent: Jan. 9, 1990

[54] METHOD FOR MANUFACTURING SEMICONDUCTOR INTEGRATED CIRCUITS INCLUDING CMOS AND HIGH-VOLTAGE ELECTRONIC DEVICES

[75] Inventors: Antonio Andreini, Milan; Claudio Contiero, Buccinasco; Paola Galbiati, Monza, all of Italy

[73] Assignee: SGS Microelettronica S.p.A., Catania, Italy

[21] Appl. No.: 28,842

[22] Filed: Mar. 23, 1987

[30] Foreign Application Priority Data

Mar. 27, 1986 [IT] Italy ................................ 19906 A/86

[51] Int. Cl.$^4$ ...................... H01L 21/70; H01L 21/76
[52] U.S. Cl. .......................................... 437/29; 437/34; 437/59; 437/56; 437/57; 437/74; 437/75; 437/77; 437/153; 437/149; 437/154
[58] Field of Search ........................ 437/26, 27, 28, 29, 437/30, 34, 40, 41, 56, 57, 59, 61, 74, 75, 77, 153, 154, 149; 357/42, 48, 44

[56] References Cited

U.S. PATENT DOCUMENTS

Re. 30,282  5/1980  Hunt et al. .......................... 437/74
4,021,270  5/1977  Hunt et al. .......................... 437/74
4,054,899  10/1977  Stehlin et al. ....................... 437/74
4,325,180  4/1982  Curran ................................ 437/27
4,346,512  8/1982  Liang et al. ......................... 437/74
4,628,341  12/1986  Thomas ....................... 148/DIG. 9
4,694,562  9/1987  Iwasaki et al. ..................... 437/41

FOREIGN PATENT DOCUMENTS 0149772  12/1978  Japan ................................... 437/74

Primary Examiner—Brian E. Hearn
Assistant Examiner—M. Wilczewski
Attorney, Agent, or Firm—Guido Modiano; Albert Josif

[57] ABSTRACT

This method, requiring a reduced number of process phases and providing an efficient, high-voltage structure, comprises forming a P-well region of the N-channel transistor of a CMOS device, by means of boron atom implant through a protective mask, forming at least one insulation region surrounding the CMOS device, forming edge regions having the same conductivity type as the insulation region but with a smaller concentration of impurities on at least one part of the insulation region and in the high-voltage electronic devices by means of the same boron atom implant used to form the P-well region.

5 Claims, 6 Drawing Sheets

METHOD FOR MANUFACTURING SEMICONDUCTOR INTEGRATED CIRCUITS INCLUDING CMOS AND HIGH-VOLTAGE ELECTRONIC DEVICES

BACKGROUND OF THE INVENTION

The present invention relates to a method for manufacturing semiconductor integrated circuits including CMOS and high-voltage electronic devices.

The need is currently increasingly felt to integrate on a single silicon chip signal processing logics and high-voltage components which operate efficiently and reliably. In particular, in these structures the junctions where the electric field is strongest should resist to the applied voltages to prevent avalanche breakdowns of the same junctions.

In the case of bipolar-technology integrated circuits of the type comprising an insulated drive transistor and a vertical power transistor, the problem of voltage withstanding ability has been met by using a planar field plate obtained by extending the metalizations of suitable regions on thick oxide beyond the junctions to be protected. An example of this solution is indicatively shown in FIG. 1, illustrating a cross section through a silicon wafer accommodating an insulated NPN drive transistor 1 and a vertical NPN power transistor 2. In detail, as can be seen, the structure comprises a substrate 5 of the N+ type connected as a collector of the power transistor 2, an epitaxial layer 6 of the N− type, a region 7 of the P+ type constituting the base of the transistor 2 and forming, with the layer 6, a junction 21, as well as an emitter region 8 of the N+ type provided inside the region 7. In the layer 6, the P type buried layer 9 is furthermore formed which extends up to the upper surface of the circuit by means of P+ type insulation portions 10 so as to separate the transistor 1 from the remaining area. In particular, inside the isolation 9, 10, an N− type collector region 11 is enclosed, and the P type base region 12 and the N+ type, respectively collector and emitter, regions 13 and 14 are formed. The structure is completed by the oxide layer 15 extending selectively on the upper main surface of the device, the collector 16, emitter 17, base 18 metal layers of the drive transistor 1, and the emitter 19 and base 20 metal layers of the power transistor 2. In this structure, the junctions most subject to the risk of breakdown and which are therefore to be protected are constituted by the base/collector junction 21 between the layers 6 and 7 of the power device 2 and the isolation/collector junction 22 between the regions 10 and 6 for the isolation regions. Accordingly, on the surface of the device field plates 23 and 20 have been provided for junction 22 and for junction 21, respectively, while the short-circuit metalization or metal layer 24 between the isolation 10 and the base 7 also constitutes a field plate.

It is known (see, e.g., F. Conti, M. Conti "Surface breakdown in silicon planar diodes equipped with field plate", Solid State Electronics, 1972, Vol. 5, pages 93–105) that this kind of solution has a limited efficiency because of the high electric field induced on the surface of the silicon proximate to the termination of the same field plate.

Solutions using the field plate have also been used in the case of integrated circuits produced in MOS technology. A known solution, integrating a CMOS drive device 40 with a power DMOS transistor 41 is illustrated by way of example in FIG. 2. This figure depicts the N+ type layer 30 connected as a drain D of the DMOS 41 and the N− epitaxial layer 31. Inside the layer 31, the P type buried layer 32 is provided, which is connected to the P+ type isolation regions 32', which in turn enclose the N− type epitaxial pocket 33, constituting the body of the P-channel MOS transistor of the CMOS 40. Inside the pocket 33, the drain region 34 and source region 35 of the P-channel transistor of the CMOS are provided, together with the N+ type region 36 as short circuit between the body and the source, and with the P− type P-well region 37 constituting the body of the N-channel transistor of the CMOS 40. Inside the region 37, therefore, the drain 38 and source 39 regions of the N+ type are formed. In turn, the power DMOS 41 comprises the P type body regions 55 in which the N+ type source regions 56 are provided. On the outer face of the device, the portions 46 of the isolation oxide layer are furthermore visible, together with metalization 49 connected to the left insulation region 32', provided on the polysilicon biplanar electrode 45 and constituting a triplanar field plate, the drain 50 and source 51 metalization of the P-channel transistor of the CMOS and drain 52 and source 53 metalizations of the N-channel transistor of the CMOS. The figure furthermore shows the gate electrodes 47 and 48 of the P and N channel transistors of the CMOS and, for the power transistor 41, the source metalization 58 which extends to the isolation region 32' and constitutes a planar field plate, the source metalization 59, also provided above the biplanar polysilicon electrode 45' and constituting therewith a triplanar field plate, as well as the gate electrode 57. In this case the junctions to be protected are represented by the body/drain junction 60 between the layers 55 and 31 of the power device and the isolation/drain junction 61 between the regions 32' and 31. In this case the field plate is triplanar due to the presence of the two levels of polysilicon and of one level of metalization.

This known solution, though it offers greater efficiency with respect to the previous one, still gives rise, in this case, to a significant increase in the surface electric field at the transitions between the different levels of the field plate, with the consequent risk of degrading the characteristics of the circuit.

In order to reduce the surface electric field and to make it more uniform, border solutions have also been proposed (see Viktor A. K. Temple "Junction Termination Extension (JTE), a new technique for increasing avalanche breakdown voltage and controlling surface electric fields in P-N junctions", Int. Electron Devices Meeting, 1977, New York, p. 423–426; B. J. Baliga "High-voltage device termination technique. A comparative review", IEE Proc. Vol. 129, Pt I, No. 5, 10/1982; Shikayuki Ochi et al., "Computer Analysis of Breakdown Mechanism in planar power MOSFET", IEEE Trans. on Electron Devices, Vol. ED-27, No. 2, 2/1980) such as the one illustrated in FIG. 3, which represents the cross section through a silicon wafer integrating a vertical N-channel DMOS transistor, using this solution. As can be seen, in a structure comprising an N+ type substrate 65 and an N− type epitaxial layer 66 comprising body regions 67, the structure indicated with the reference numeral 68 is provided, with P type conductivity. This structure 68 comprises a first portion 68' which forms a body and two regions 68" and 68'" again with P type conductivity but with a smaller surface concentration of doping impurities. In practice, the regions 68', 68" and 68'" extend with decreasing thickness towards the interior of the DMOS device. This solution is particularly advantageous and allows to achieve efficient and reliable high voltage devices. A process according to this technique for obtaining in the same chip a CMOS and a DMOS device is shown in FIG. 6a-6d. The starting structure according to this prior method, shown in FIG. 6a, comprises a double epitaxial layer 70 of the N⁻ conductivity type, grown on an N+ substrate, not illustrated in the figure, and accommodating a P type buried layer 71. In particular, according to the prior art, the initial step comprises a boron implant only to provide the P-well. For this purpose, a photoresist layer 110 is provided which has a single opening or window on the surface of the device where the P-well is to be formed. Subsequently, according to this method (as can be seen in FIG. 6b), boron atoms are implanted to form the insulation of the CMOS. Only thereafter, as illustrated in FIG. 6c, boron atoms are implanted (indicated symbolically by the arrows 112) to obtain first regions of the desired border structure. For this purpose, above the device main surface an oxide layer 111 is provided, having suitable windows for the passage of the boron atoms which thus accumulate in the thin layers 113 and 114.

Finally, according to the prior art, boron is implanted (arrows 117) to provide the outermost ring or border region 115 and 116. As can thus be seen, according to the prior art, the different portions of the border extension structure of the DMOS and the CMOS devices are grown in different, subsequent steps, so that it is necessary to perform a high number of photolithographic steps, which increase the manufacturing costs.

SUMMARY OF THE INVENTION

Therefore, the aim of the present invention is to provide a method for integrating on a single silicon wafer signal processing components and high-voltage components which is efficient in terms of the voltage withstanding ability of the power device and of the insulation of the drive device and which reduces the number of photolithographic steps required according to the prior art.

Another object of the present invention is to provide an integrating method which is composed of individual steps which are per se known and already in use in the electronics industry, using already available machines.

Not least object of the present invention is to provide a method which has manufacturing costs lower than the known devices.

The above and other aims and objects are achieved by a method for manufacturing semiconductor integrated circuits, comprising CMOS devices and high-voltage electronic devices, as defined in the appended claims.

BRIEF DESCRIPTION OF THE DRAWINGS

The characteristics and advantages of the invention will become apparent from the description of a particular embodiment of the method according to the invention, illustrated only by way of non-limitative example in the following description with reference to the drawings, where.

DESCRIPTION OF THE PREFERRED EMBODIMENTS

Figure 4A:
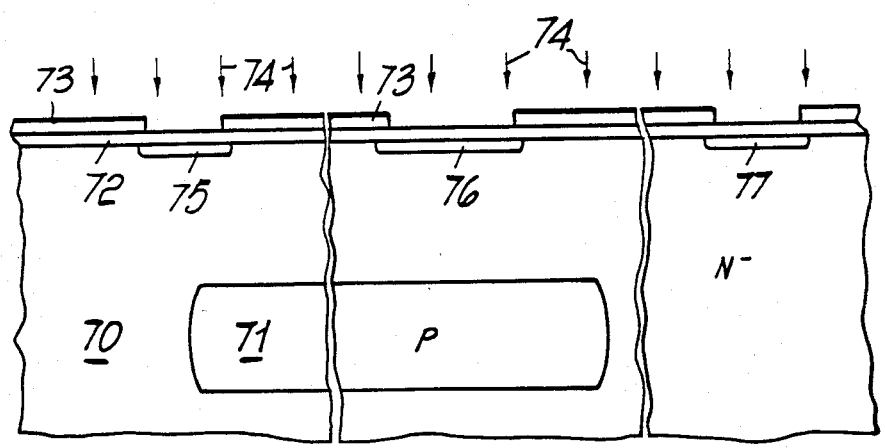
FIG. 4 is a view of three successive steps (a-c) of the method according to the invention.
Figure 4B:
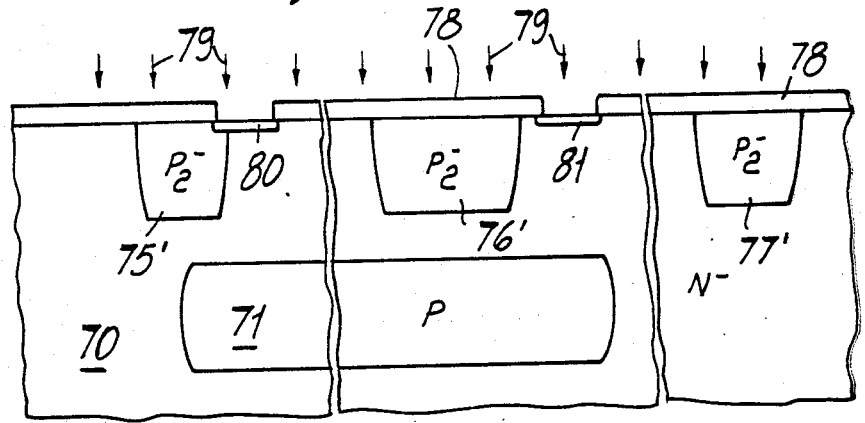
Figure 4C:
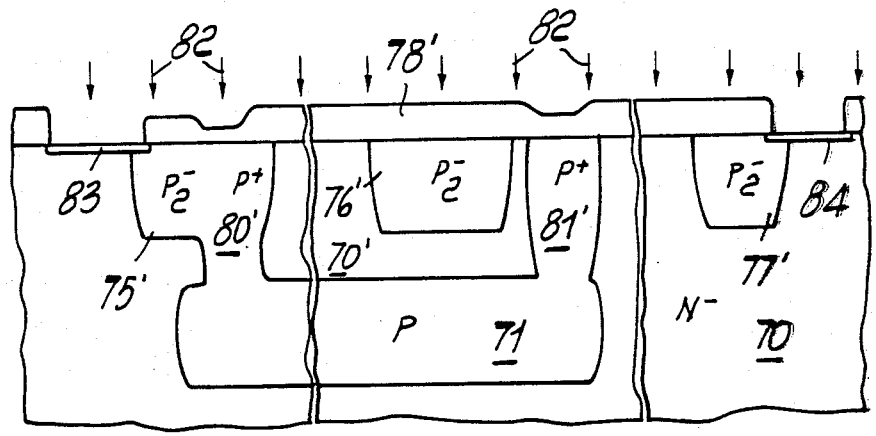
Figure 6:
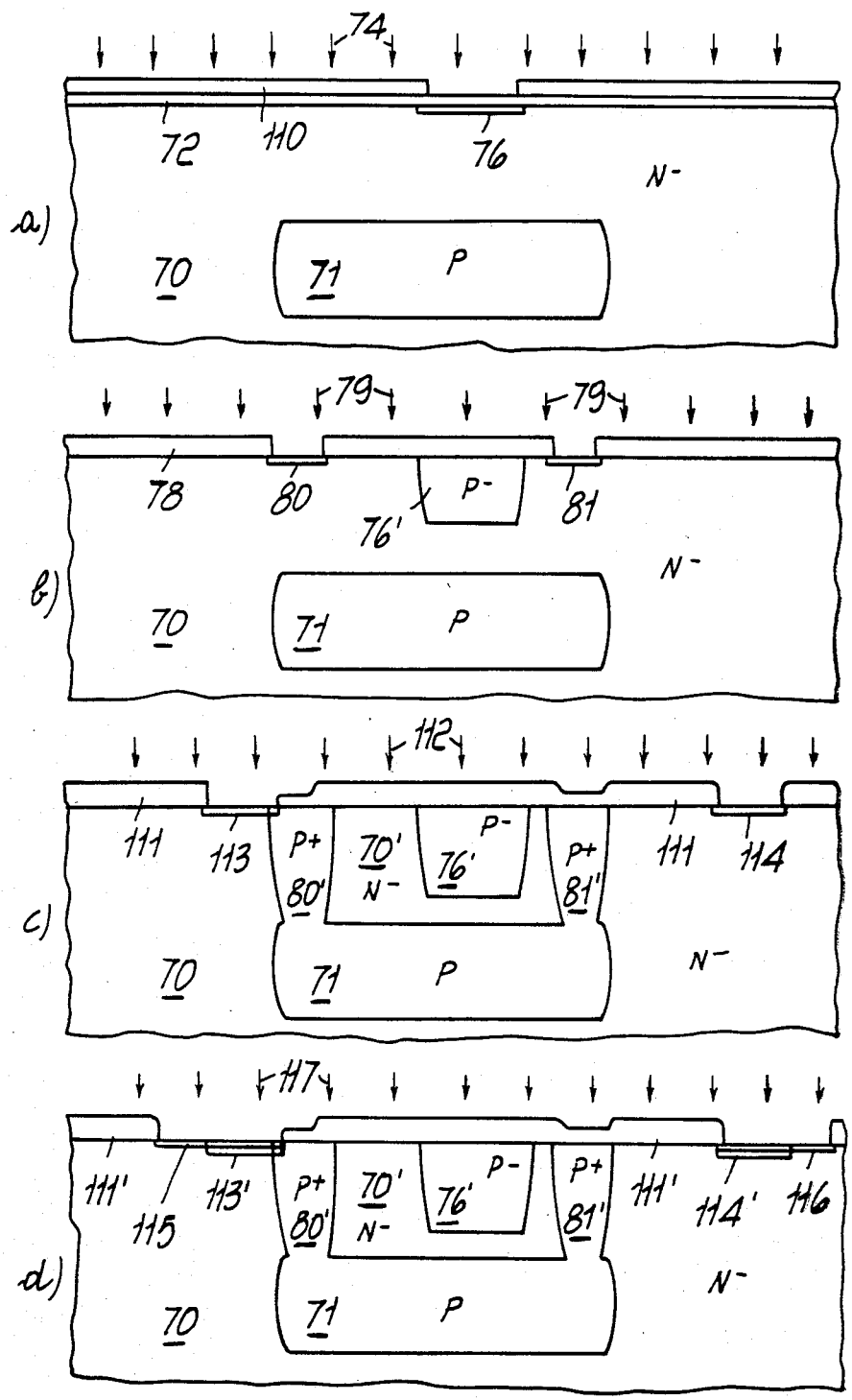
FIG. 6 is a view of four steps (a-d) of a known method for manufacturing the same integrated circuit of FIG. 5.

For the description of the method according to the invention, reference, is made to FIG. 4, illustrating three successive phases of said method. In particular, FIG. 4a shows the same starting structure of FIG. 6a, which thus has been provided with the same reference numerals. As visible, the starting structure comprises a double epitaxial layer 70 of the N⁻ conductivity type, grown on an N+ substrate not illustrated in the figure, and accommodating the P type buried layer 71. On the epitaxial layer 70, an oxide layer 72 is arranged, and, above the latter, a masking photoresist layer 73 having suitable interruptions where both the P-well of the CMOS device and the border extension regions of the CMOS and DMOS devices are to be formed. According to a first step, the semiconductor wafer is subject to a boron implant, symbolically indicated in the figure by the arrows 74. This implant in this phase leads to the accumulation of boron atoms on the uncovered regions of the surface of the device, as indicated by the thin layer 75 intended to form a portion of the border or edge structure of the isolation of the CMOS, by the thin layer 76 intended to form the P-well region of the same and by the thin layer 77 intended to form a portion of the border region of the DMOS. Subsequently, the mask 73 is removed, and, by means of a further photolithographic step, an oxide layer 78 is deposited, having suitable windows for implanting therethrough insulation boron; this boron implant being symbolically indicated in FIG. 4b by the arrows 79. At this point, the atoms implanted in the thin layers 75, 76 and 77 have already been diffused, forming a portion of the border region the CMOS 75' of the the CMOS P-well region 76' and a portion of the DMOS border region 77'. As a consequence of this second boron implant, thin layers 80 and 81 form at the windows in the oxide 78, which layers, mutually connected and forming a ring in the view from above, are intended to constitute the insulation region encircling the epitaxial pocket accommodating the CMOS device. Subsequently, a further boron implant is carried out to form outer border extension regions. During this step, the upper surface of the silicon wafer is covered by an oxide layer 78' having suitable windows for allowing a boron implant, indicated by the arrows 82. During this step, the thin layers 83 and 84 are formed, which layers are intended to form the outer portions of the border region, while the atoms contained in the thin layers 80 and 81 will have already been diffused, reaching the buried layer 71 and forming the more heavily doped P+ type regions 80' and 81'.

As can be seen, the boron implant for forming the P-well of the CMOS N-channel transistor, masked by means of a photoresist layer and carried out according to the prior art at the beginning of the manufacturing method, according to the invention, is also used for forming part of the border region of the CMOS isolation regions and of the high-voltage DMOS.

Figure 1:
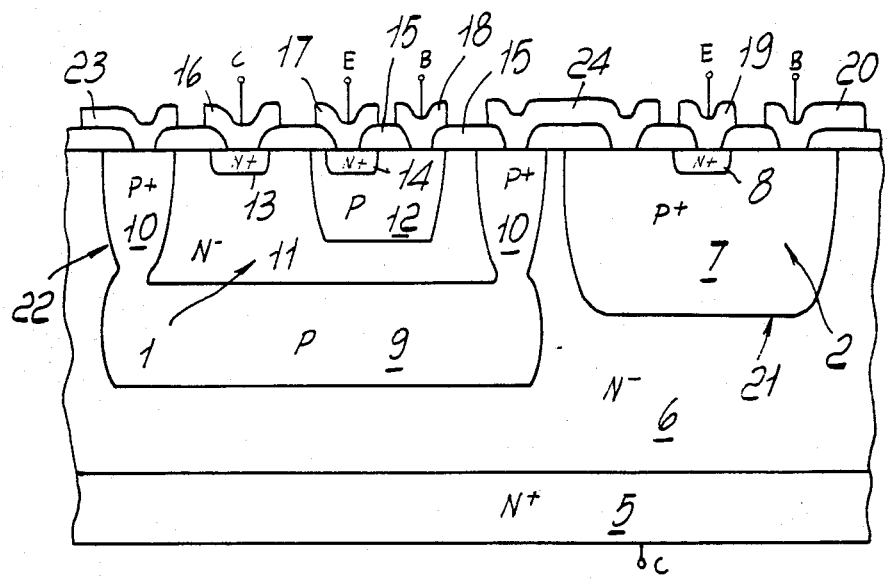
FIGS. 1 to 3 are cross section views through known devices.
Figure 3:
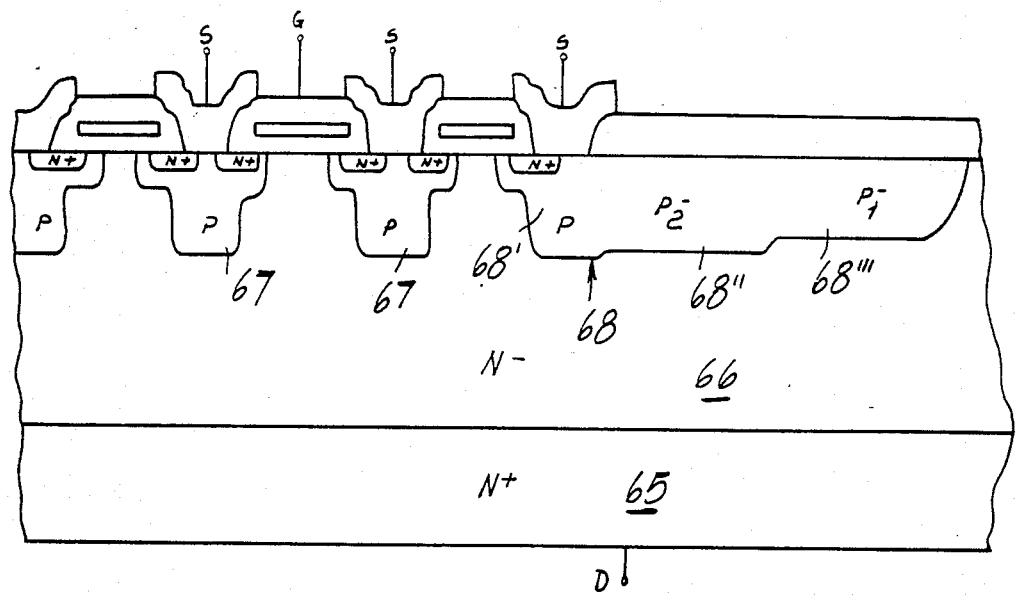
Figures 2, 5:
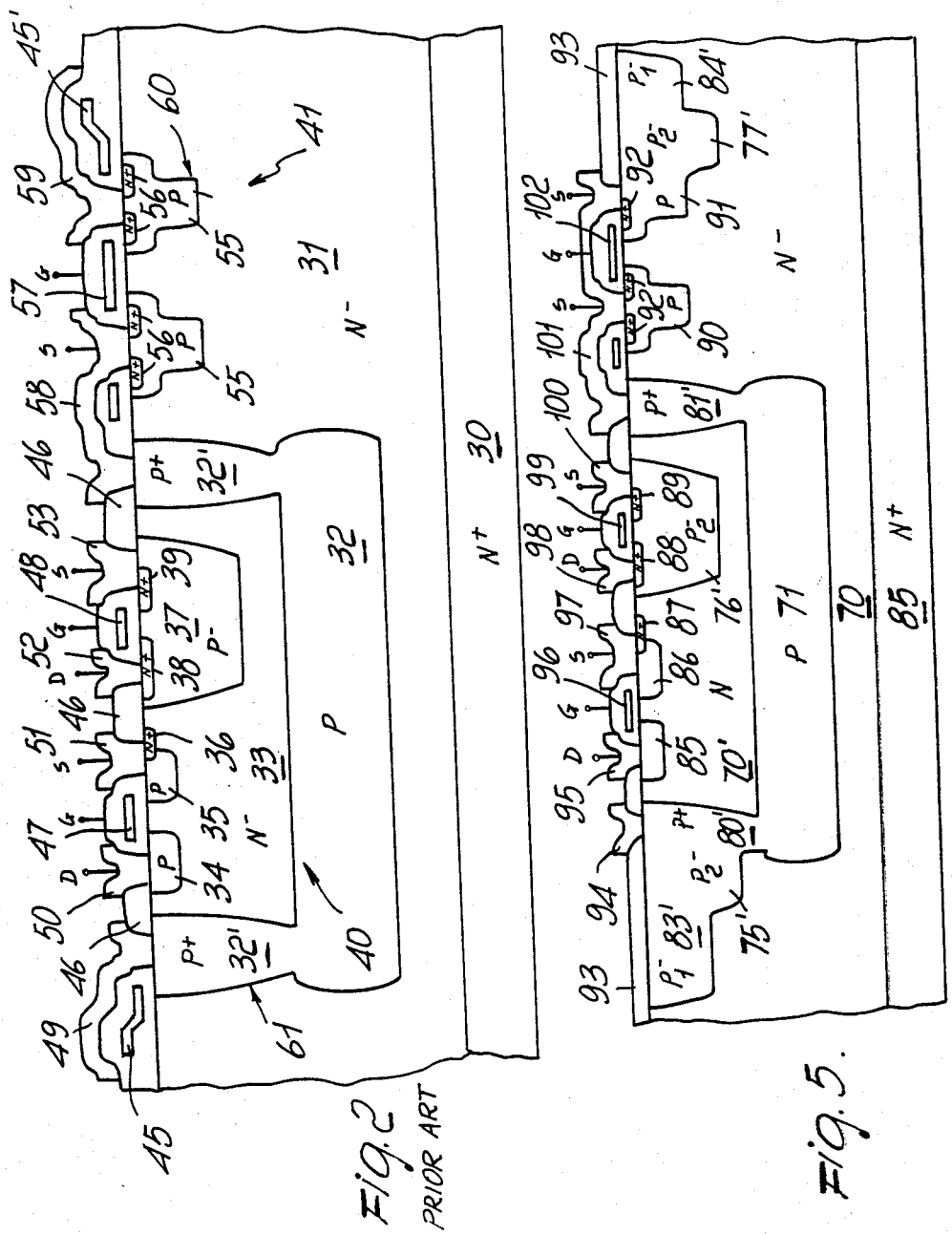
FIG. 5 is a cross section view through a silicon wafer in which an integrated circuit has been formed using the method according to the invention.

Subsequently, additional known manufacturing steps for the completion of the CMOS device and of the DMOS are performed. Thus, the final structure as illustrated in FIG. 5 is obtained, in which the parts which are identical to the ones of FIG. 4 have been assigned the same reference numerals.

In particular, thus, the complete device comprises the N+ type substrate 85, the N− type epitaxial layer 70, the P type buried layer 71 connected to the P+ type isolation regions 80' and 81' and P− type ones 75' and 83'.

The parts 75' and 83' have been indicated as being of a $P_2^-$ and $P_1^-$ conductivity type to point out the fact that they normally have different doping levels and more specifically in general the outer region is less doped. Within the N− type epitaxial region 70' which constitutes the body of the P-channel transistor of the CMOS, the regions 85 and 86, respectively drain and source of the P-channel transistor, as well as the N+ type region 87 acting as short circuit between the source and the body, and the P-well region 76' are provided. The N+ type regions 88 and 89, respectively drain and source of the N-channel transistor, are thus provided in the region 76'.

The DMOS device is shown to the right of the figure, as including the P type body region 90, the N+ type source regions 92 and the P type region 91 having the same characteristics as the region 90 and connected to the border structure formed by said portions 77' and 84' of said. Also here the outer region 84' is generally more lightly doped than the region 77'. Another N+ source region 92 is accommodated in the region 91. The device is completed by the surface oxide portions 93, by the metalizations 94 connected to the insulation regions 80' and 81', by the drain metalization 95, by the source metalization 97 of the P-channel transistor, as well as by the drain metalization 98 and the source metalization 100 of the N-channel transistor of the CMOS device. The reference numerals 96 and 99 indicate the gate electrodes respectively of the P-channel device and of the N-channel device. The metalization 101 connect the insulation region 81' to the source of the DMOS, while the gate electrode is indicated at 102.

By means of the method according to the invention, a structure has thus been provided which integrates CMOS devices with vertical power components, with a solution which allows to achieve a high efficiency in terms of breakdown voltage, simultaneously keeping low the number of photolithographic steps required for its production. Indeed, with the method according to the invention it is possible to use a smaller number of steps with respect to a conventional method, as can be clearly deduced from a comparative examination of FIGS. 4 and 6.

According to studies carried out by the inventors, the growth of a border structure according to the invention does not degrade the electrical features of the device, allowing, on the contrary, to provide a highly efficient and reliable structure.

Indeed, the requirements of the circuit in which the CMOS logic is inserted determine the characteristics of the P-well region, in particular its surface concentration of impurities in order to obtain precise threshold values for the N-channel transistor of the CMOS. In particular, it has been proved that for P-well impurities having a surface concentration such as to have a threshold voltage of the N-channel transistor of the CMOS ranging between 0.8 and 1.2 V, the DMOS power stage can withstand a maximum voltage of 500 V.

Figure 7:
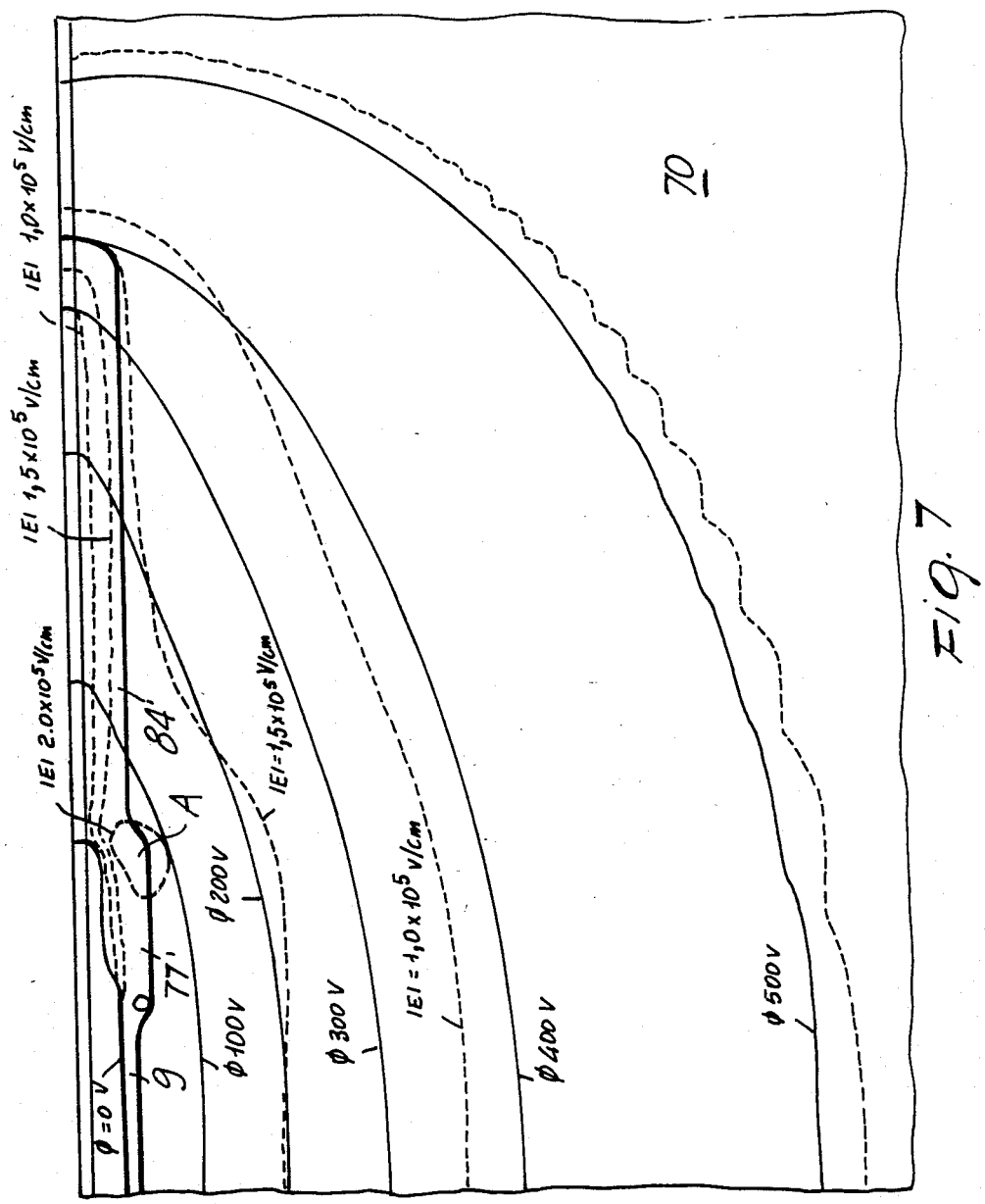
FIGS. 7-9 are cross section views of the border of the DMOS transistor according to FIG. 5, illustrating the electric field in the case of high-voltage electronic devices to which the maximum polarizing voltage is applied, and in which the border regions have a different doping levels.

This fact is illustrated in FIG. 7, which illustrates a cross section of the border region of the DMOS of FIG. 5 formed in an epitaxial silicon layer of the N− type with a resistivity of 22.5 ohm/cm and a thickness of 50 microns, in which the inner border extension region (region 91) has the doping level as above mentioned. This figure shows with solid lines the potential pattern and with broken lines the electric field when the DMOS is polarized at a reverse voltage of 500 V. In this figure, A indicates the curved portion of the inner border region in which there is the maximum electric field. The value of the latter has been calculated according to different doping levels of the P-well. In particular, with an implant dose of $1 \times 10^{14}$ cm$^{-2}$ (corresponding to a surface concentration of $1 \times 10^{16}$ cm$^{-3}$ and a threshold voltage of 0.8 V of the N-channel transistor with 850 Å gate oxide) there is an electric field of $2.2 \times 10^5$ V/cm; with an implant dose of $1.4 \times 10^{14}$ cm$^{-2}$ (corresponding to a surface concentration of $1.4 \times 10^{16}$ cm$^{-3}$ and a threshold voltage of 1 V) there is an electric field of $2.3 \times 10^5$ V/cm; while with an implant dose of $1.7 \times 10^{14}$ cm$^{-2}$ (corresponding to a surface concentration of $1.8 \times 10^{16}$ cm$^{-3}$ and a threshold voltage of 1.2 V) there is a maximum electric field of $2.3 \times 10^5$ V/cm. As can be seen, the surface electric field remains practically constant, and the maximum electric field in the different regions of the device always remains lower than the critical electric field value ($2.4 \times 10^5$ V/cm) at which the avalanche breakdown of the junction occurs. In this way it is possible to ensure a maximum voltage of 500 V also in presence of variations in the threshold voltage of the N-channel transistor of the CMOS.

Studies carried out by the inventors have proved that if the threshold voltage of the N-channel transistor of the CMOS must be lower than 0.8 V, it is possible to ensure a maximum voltage of 500 V by making use of a simplified solution comprising a single ring, implanted simultaneously with the P-well boron implant, i.e. eliminating the outermost region 84', and thus saving another photolithographic step.

Figure 8:
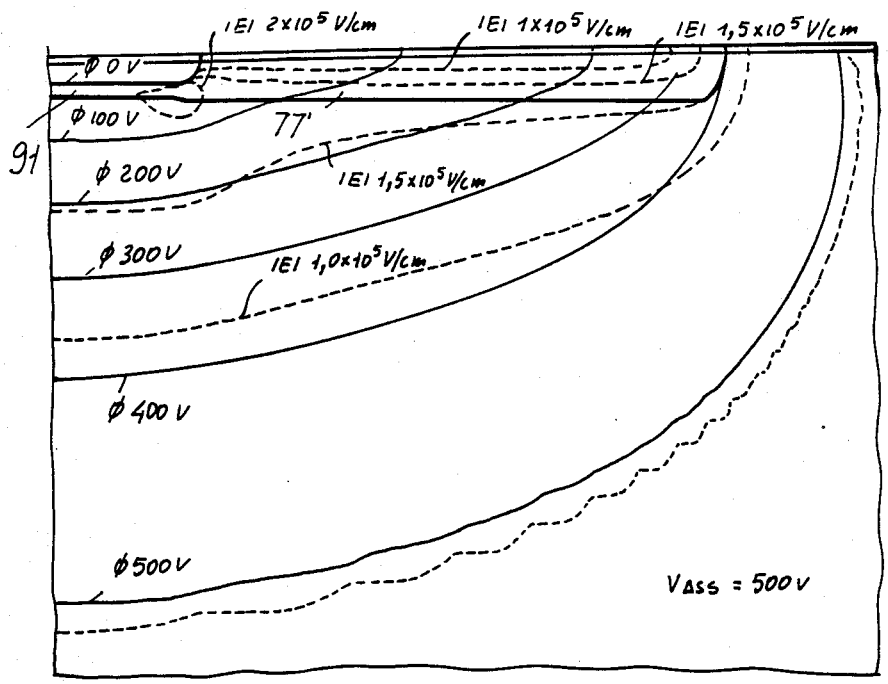
Figure 9:
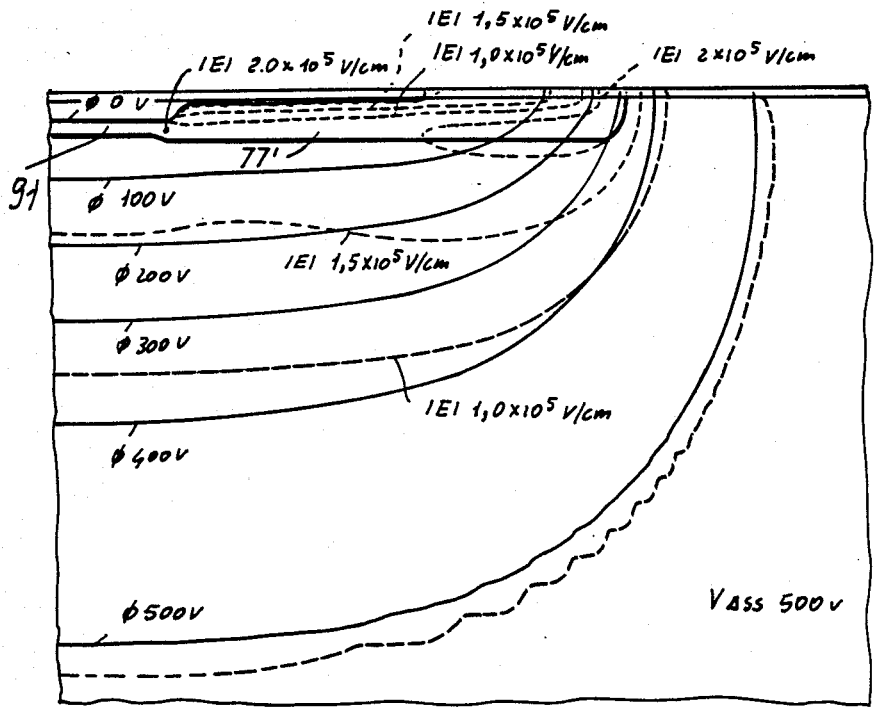

FIGS. 8 and 9 furthermore illustrate cross sections of such simplified border of the DMOS, polarized at 500 V, and the distribution of potential (indicated with solid lines) and of the electric field (indicated with broken lines) when the P-well is formed by implant with a dose of respectively $6 \times 10^{13}$ cm$^{-2}$ and $8 \times 10^{13}$ cm$^{-2}$. These implant doses correspond to respective surface concentrations of $6 \times 10^{15}$ cm$^{-3}$ and $8 \times 10^{15}$ cm$^{-3}$ and threshold voltages of 0.5 and 0.6 V for an N-channel MOS transistor with 850 Å gate oxide.

As can be seen, the maximum values of the electric field, even in this case, are still lower than the critical electric field.

As can be seen from the previous description, the invention fully achieves the intended aims. Indeed, a method has been devised which is capable of allowing the integration of a CMOS drive device and of a power device having high efficiency and requiring a reduced number of productive steps, by virtue of the fact that the boron implant required to form the P-well region is also used to obtain one region of the border extension structure. A further improvement results with the solution shown in FIGS. 8 and 9, as above explained.

Furthermore, the device according to the invention, having P-well region and one region of the border extension structure with the same doping level, presents manufacturing costs which are lower than conventional devices of the same type by virtue of the lower manufacturing steps but, as demonstrated above, unexpectedly does not present a worse or degraded electrical behaviour with respect to known devices of the same kind.

The invention thus conceived is susceptible to numerous modifications and variations, all of which are within the scope of the inventive concept. In particular, though the process described made reference to the production of a DMOS for the power device, said method can be applied exactly also for the production of NPN vertical power transistors or for DMOS transistors with a P substrate (CMD).

In particular, within the concept of the present invention, the extension structure formed by the regions 83' and 75' on the left isolation region 80' can be formed also for the lateral isolation regions extending above and below the drawing plane and thus not visible, as well as for the right insulation region 81'. Furthermore, also the left cell of the DMOS (body 90) can be provided with a drain extension, so as to obtain extension regions similar but specularly arranged to the regions 77' and 84'. In this case a third conventional cell, like the one formed by the body 90, can be arranged therebetween to supply a sufficient current.

Lastly, if the CMOS device does not require protection of the isolation/drain junction, the border extension region formed by regions 75' and 83' can be omitted, within the inventive concept.

Moreover, all the details may be replaced with technically equivalent elements.

We claim:

1. In a method for manufacturing semiconductor integrated circuits comprising a CMOS device and a high voltage electronic device, the CMOS device including an N-channel transistor having a P-well region and said high voltage electronic device having a border region in which an extended border portion is diffused to withstand the high voltage, the only step of simultaneously implanting the P-well region and at least one part of said extended border portion at said border region, by implanting impurities having a P-type conductivity and a preset concentration with a protective mask obtained through a single photolithographic step.

2. In a method for manufacturing semiconductor integrated circuits comprising a CMOS device and a high voltage electronic device, with the CMOS device including an N-channel transistor having a P-well region being surrounded by a CMOS isolation region, said CMOS device having a first extended border portion and said high voltage electronic device having a border region in which a further extended border portion is diffused,
the only step of simultaneously implanting the P-well region, at least one part of said first extended border portion and at least one part of said further extended border portion, by implanting impurities having a P-type conductivity and a first concentration with a protective mask obtained through a single photolithographic step.

3. A method according to claim 1, wherein said impurities are boron atoms.

4. In a method for manufacturing semiconductor integrated circuits comprising a CMOS device and a high voltage electronic device, with the CMOS device including an N-channel transistor having a P-well region being surrounded by a CMOS isolation region, said CMOS device having a first extended border portion being diffused adjacent to said CMOS isolation region and said high voltage electronic device having a border region in which a further extended border portion is diffused,
the first step of simultaneously implanting the P-well region, a first part of said first extended border portion and a first part of said further extended border portion, by implanting impurities having a P-type conductivity and a first concentration with a first protective mask obtained through a single photolithographic step,
the second step of implanting said isolation region by implanting impurities having said P-type conductivity and a second concentration with a second protective mask and
the further step of implanting at least one second part of said first extended border portion, by implanting impurities having said P-type conductivity and a further concentration lower than said first concentration with a further protective mask.

5. A method according to claim 4, wherein said impurities are boron ions.

* * * * *